US012641728B2

(12) United States Patent
Izawa et al.

(10) Patent No.: US 12,641,728 B2
(45) Date of Patent: May 26, 2026

(54) METHOD FOR MANUFACTURING SUBSTRATE WITH BUILT-IN COMPONENTS, AND SUBSTRATE WITH BUILT-IN COMPONENTS

(71) Applicant: Resonac Corporation, Tokyo (JP)

(72) Inventors: Hiroyuki Izawa, Tokyo (JP); Hikari Murai, Tokyo (JP); Nozomu Takano, Tokyo (JP); Kunihiko Akai, Tokyo (JP); Yuka Itoh, Tokyo (JP); Masashi Ohkoshi, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 476 days.

(21) Appl. No.: 18/019,636

(22) PCT Filed: Aug. 6, 2021

(86) PCT No.: PCT/JP2021/029404
§ 371 (c)(1),
(2) Date: Feb. 3, 2023

(87) PCT Pub. No.: WO2022/030635
PCT Pub. Date: Feb. 10, 2022

(65) Prior Publication Data
US 2023/0397337 A1      Dec. 7, 2023

(30) Foreign Application Priority Data

Aug. 7, 2020    (JP) ................................. 2020-135145

(51) Int. Cl.
H05K 1/182 (2026.01)
H05K 1/03 (2006.01)
(Continued)

(52) U.S. Cl.
CPC ........... H05K 1/182 (2013.01); H05K 1/0306 (2013.01); H05K 3/1283 (2013.01); H05K 3/321 (2013.01);
(Continued)

(58) Field of Classification Search
CPC ...... H05K 1/182; H05K 1/185; H05K 3/1283; H05K 3/321; H05K 3/4652;
(Continued)

(56) References Cited

U.S. PATENT DOCUMENTS 5,136,365 A * 8/1992 Pennisi .................. H05K 3/323
252/514
6,111,628 A * 8/2000 Shiota .................... H05K 3/323
349/149
(Continued)

FOREIGN PATENT DOCUMENTS

JP      2001-326469 A      11/2001
JP      2002-359319 A      12/2002
(Continued)

*Primary Examiner* — Donghai D Nguyen
(74) *Attorney, Agent, or Firm* — FITCH, EVEN, TABIN & FLANNERY, LLP

(57) ABSTRACT

A method for manufacturing a substrate with built-in components includes providing an intermediate member including an electronic component with a first electrode provided on a first surface thereof, and a first electrically conductive layer provided on the first surface of the electronic component so as to cover the first electrode, and forming a first insulating resin layer on a first surface of the intermediate member. The first electrically conductive layer includes a first curable adhesive layer formed from a curable adhesive layer including electrically conductive particles and a cured adhesive composition, and a first metal foil layer disposed on the first curable adhesive layer that is a surface on a side opposite to the electronic component. The electrically con- (Continued)

ductive particles of the first curable adhesive layer electrically connect the first electrode of the electronic component and the first metal foil layer.

18 Claims, 6 Drawing Sheets

(51) Int. Cl.

| | | |
|---|---|---|
| *H05K 3/12* | (2006.01) | |
| *H05K 3/321* | (2026.01) | |
| *H05K 3/46* | (2006.01) | |

(52) U.S. Cl.
CPC ... *H05K 3/4652* (2013.01); *H05K 2203/1105* (2013.01)

(58) Field of Classification Search
CPC ......... H05K 2203/1105; H05K 3/4602; H05K 2203/1469; H05K 3/06; H01L 23/5389; Y10T 29/49146; Y10T 29/49155; Y10T 29/49165

See application file for complete search history.

(56) References Cited

U.S. PATENT DOCUMENTS

| | | | | |
|---|---|---|---|---|
| 8,654,536 B2 * | 2/2014 | Ostmann | .............. | H05K 1/0271 |
| | | | | 361/764 |
| 9,635,763 B2 * | 4/2017 | Ueta | ...................... | H05K 3/301 |

FOREIGN PATENT DOCUMENTS

| | | | |
|---|---|---|---|
| JP | 2005-045228 | A | 2/2005 |
| JP | 2007-103441 | A | 4/2007 |
| JP | 2012-151154 | A | 8/2012 |
| JP | 2012-191204 | A | 10/2012 |
| KR | 10-2011-0082604 | A | 7/2011 |
| WO | 2008/139995 | A1 | 11/2008 |

* cited by examiner 60,70

64,74

63,73

61,71          61,71          62,72  65,75

(a)

(b)

(c)

(d)

(a)

(b)

(c)

(a)

(b)

(c)

(d)

(a)

(b)

(c)

METHOD FOR MANUFACTURING SUBSTRATE WITH BUILT-IN COMPONENTS, AND SUBSTRATE WITH BUILT-IN COMPONENTS

TECHNICAL FIELD

The present disclosure relates to a method for manufacturing a substrate with built-in components, and a substrate with built-in components.

BACKGROUND ART

Patent Literature 1 discloses a method for manufacturing a printed wiring board into which an electronic component such as an IC chip is built.

CITATION LIST

Patent Literature

Patent Literature 1: Japanese Unexamined Patent Publication No. 2012-191204

SUMMARY OF INVENTION

Technical Problem

In a conventional method for manufacturing a substrate with built-in components, as illustrated in FIGS. 5(a) and 5(b), insulating resin layers 102 and 103 are formed on both sides in a lamination direction of an electronic component 101 provided with electrodes 101a. Thereafter, as illustrated in FIGS. 5(c) and 5(d), hole formation by laser, formation of a plated layer, electrode formation by etching, and the like are performed to form via electrodes 104 and 105 reaching each electrode 101a of the electronic component 101 in the insulating resin layers 102 and 103, respectively. Then, as illustrated in FIGS. 6(a) to 6(c), formation of additional insulating resin layers 106 and 107, formation of via electrodes 108 by hole formation by laser and formation of a plated layer, electrode formation by etching, and the like are repeated to form a substrate 110 with built-in components. However, in such a method for manufacturing a substrate with built-in components, one electrically conductive layer (via electrode) is formed by performing lots of treatments, it is necessary to repeat these treatments in order to form a plurality of electrically conductive layers, and thus the manufacturing process is very cumbersome.

In this regard, an object of the present disclosure is to provide a method for manufacturing a substrate with built-in components in which a manufacturing process is simplified, and a substrate with built-in components.

Solution to Problem

The present disclosure relates to a method for manufacturing a substrate with built-in components, as an aspect. This method for manufacturing a substrate with built-in components includes: a step (a) of providing an intermediate member including an electronic component with a first electrode provided on a first surface thereof and a first electrically conductive layer provided on the first surface of the electronic component so as to cover the first electrode; and a step (b) of forming a first insulating resin layer on a first surface of the intermediate member. The first electrically conductive layer includes a first curable adhesive layer formed from a curable adhesive layer including electrically conductive particles and a cured adhesive composition, and a first metal foil layer disposed on the first curable adhesive layer that is a surface on a side opposite to the electronic component. The electrically conductive particles of the first curable adhesive layer electrically connect the first electrode of the electronic component and the first metal foil layer.

In this method for manufacturing a substrate with built-in components, the first electrically conductive layer of the intermediate member provided in the step (a) is configured to have a first curable adhesive layer formed from a curable adhesive layer including electrically conductive particles and a cured adhesive composition and a first metal foil layer, and the electrically conductive particles of the first curable adhesive layer electrically connect the first electrode of the electronic component and the first metal foil layer. In this case, since the intermediate member including the electronic component can be simplified, the method for manufacturing a substrate with built-in components can be simplified.

In this method for manufacturing a substrate with built-in components, the intermediate member may further include a second electrically conductive layer provided on a second surface on a side opposite to the first surface of the electronic component, and a second electrode may be provided on the second surface on a side opposite to the first surface of the electronic component. The second electrically conductive layer includes a second curable adhesive layer formed from a curable adhesive layer including electrically conductive particles and a cured adhesive composition, and a second metal foil layer disposed on the second curable adhesive layer that is a surface on a side opposite to the electronic component. The electrically conductive particles of the second curable adhesive layer electrically connect the second electrode of the electronic component and the second metal foil layer. In this case, since simplified electrically conductive layers are provided on both surfaces of the electronic component, the method for manufacturing a substrate with built-in components can be more simplified.

In the method for manufacturing a substrate with built-in components, the step (a) of providing an intermediate member may have a step (a1) of preparing the electronic component, a step (a2) of preparing a first adhesive film, a step (a3) of bonding the first adhesive film to the first surface of the electronic component so as to cover the first electrode, and a step (a5) of heating and pressure-bonding the first adhesive film to the electronic component. The first adhesive film includes a first adhesive layer formed from an adhesive layer which includes electrically conductive particles and an adhesive composition and in which the electrically conductive particles are dispersed in the adhesive composition, and the first metal foil layer disposed on the first adhesive layer that is a surface on a side opposite to the electronic component. In the step (a5) of heating and pressure-bonding, the first adhesive film is heated and pressure-bonded to cause the electrically conductive particles of the first adhesive film to electrically connect the first electrode of the electronic component to the first metal foil layer, and the adhesive layer of the first adhesive film is cured to obtain the first curable adhesive layer. In this case, since an electrically conductive layer is formed using an adhesive film including electrically conductive particles dispersed in an adhesive composition, an electrically conductive layer connecting electrodes separated from each other in the lamination direction can be easily formed without performing cumbersome processes such as hole formation by laser, formation of a plated layer, and electrode formation by etching. As a result, the method for manufacturing a substrate with built-in components can be more simplified. Note that, the order of the steps (a1) to (a3) and (a5) performed is not limited to the order described above, and the order thereof can be appropriately changed.

In the method for manufacturing a substrate with built-in components, the step (a) of providing an intermediate member may include a step (a1) of preparing the electronic component, a step (a2) of preparing a first adhesive film and a second adhesive film, a step (a3) of bonding the first adhesive film to the first surface of the electronic component so as to cover the first electrode, a step (a4) of bonding the second adhesive film to the second surface of the electronic component so as to cover the second electrode, and a step (a5) of heating and pressure-bonding the first adhesive film and the second adhesive film to the electronic component. The first adhesive film includes a first adhesive layer formed from of an adhesive layer which includes electrically conductive particles and an adhesive composition and in which the electrically conductive particles are dispersed in the adhesive composition, and the first metal foil layer disposed on the first adhesive layer that is a surface on a side opposite to the electronic component. Furthermore, the second adhesive film includes a second adhesive layer formed from an adhesive layer which includes electrically conductive particles and an adhesive composition and in which the electrically conductive particles are dispersed in the adhesive composition, and the second metal foil layer disposed on the second adhesive layer that is a surface on a side opposite to the electronic component. Note that, the order of the steps (a1) to (a5) is not limited to the order described above, and the order thereof can be appropriately changed. For example, the order of the step (a1) and the step (a2) performed is not limited, the step (a1) may be first performed, conversely, the step (a2) may be first performed, and the step (a1) and the step (a2) may be simultaneously performed. Furthermore, for example, the order of the step (a3) and the step (a4) performed is not limited, the step (a3) may be first performed, conversely, the step (a4) may be first performed, and the step (a3) and the step (a4) may be simultaneously performed.

In the step (a) of heating and pressure-bonding, the first adhesive film may be heated and pressure-bonded to cause the electrically conductive particles of the first adhesive film to electrically connect the first electrode of the electronic component to the first metal foil layer, and the adhesive layer of the first adhesive film may be cured to obtain the first curable adhesive layer. Further, the second adhesive film may be heated and pressure-bonded to cause the electrically conductive particles of the second adhesive film to electrically connect the second electrode of the electronic component to the second metal foil layer, and the adhesive layer of the second adhesive film may be cured to obtain the second curable adhesive layer. In this case, since electrically conductive layers on both sides of an electronic component are formed using an adhesive film including electrically conductive particles, each electrically conductive layer connecting electrodes separated from each other in the lamination direction can be easily formed without performing cumbersome processes, such as hole formation by laser, formation of a plated layer, and electrode formation by etching, on both sides of the electronic component. As a result, according to this manufacturing method, the method for manufacturing a substrate with built-in components can be further simplified.

In the method for manufacturing a substrate with built-in components, a ratio of surface roughness Rz of a surface of at least one metal foil layer of the first metal foil layer and the second metal foil layer on a side attached to the corresponding adhesive layer with respect to an average particle diameter of the electrically conductive particles may be 0.05 to 3. In this case, as compared to a case where the aforementioned ratio of the surface roughness Rz of the adhesive layer with respect to the average particle diameter of the electrically conductive particles is more than 3, the electrically conductive particles can be more reliably crushed into a flat shape during heating and pressure-bonding so that the contact area of the electrically conductive particles with the metal foil layer and the electrode of the electronic component can be increased. As a result, electrical conduction between the metal foil layer serving as a wiring pattern or a wiring after processing and the electrode of the electronic component, can be stabilized by such electrically conductive particles. Note that, this ratio can be represented as surface roughness Rz/average particle diameter.

In the method for manufacturing a substrate with built-in components, surface roughness Rz of a surface of at least one metal foil layer of the first metal foil layer and the second metal foil layer on a side attached to the corresponding adhesive layer may be 20 μm or less. In this case, as compared to a case where the surface roughness of the surface of the metal foil layer on the adhesive layer side is rough, the electrically conductive particles can be more reliably crushed into a flat shape during heating and pressure-bonding so that the contact area of the electrically conductive particles with the metal foil layer and the electrode of the electronic component, can be increased. As a result, electrical conduction between the metal foil layer serving a wiring pattern or a wiring after processing and the electrode of the electronic component can be stabilized by such electrically conductive particles.

In the method for manufacturing a substrate with built-in components, the step (a) of providing an intermediate member may further include a step (a6) of etching at least one of the first metal foil layer and the second metal foil layer to form an outer electrode of the intermediate member.

The method for manufacturing a substrate with built-in components may further include a step (d) of forming a via conductor reaching the first metal foil layer or the outer electrode processed from the first metal foil layer in the first insulating resin layer formed on the first surface of the intermediate member.

In the method for manufacturing a substrate with built-in components, a ratio of surface roughness Rz of a surface of at least one metal foil layer of the first metal foil layer and the second metal foil layer on the corresponding curable adhesive layer side with respect to an average particle diameter of the electrically conductive particles may be 0.05 to 3. In this case, as compared to a case where the aforementioned ratio of the surface roughness Rz of the curable adhesive layer with respect to the average particle diameter of the electrically conductive particles is more than 3, the electrically conductive particles can be more reliably crushed into a flat shape so that the contact area of the electrically conductive particles with the metal foil layer and the electrode of the electronic component can be increased. As a result, electrical conduction between the metal foil layer serving as a wiring pattern or a wiring after processing and the electrode of the electronic component can be stabilized.

In the method for manufacturing a substrate with built-in components, surface roughness Rz of a surface of at least one metal foil layer of the first metal foil layer and the second metal foil layer on the corresponding curable adhesive layer side may be 20 μm or less. In this case, as compared to a case where the surface roughness of the surface of the metal foil layer on the adhesive layer side is rough, the electrically conductive particles can be more reliably crushed into a flat shape so that the contact area of the electrically conductive particles with the metal foil layer and the electrode of the electronic component can be increased. As a result, electrical conduction between the metal foil layer serving as a wiring pattern or a wiring after processing and the electrode of the electronic component can be stabilized. In this case, the surface roughness Rz of the surface of the corresponding curable adhesive layer side may be 0.5 μm or more and 5.0 μm or less, and may be 0.5 μm or more and 10 μm or less.

The method for manufacturing a substrate with built-in components may further include a step (c) of forming a second insulating resin layer on a second surface on a side opposite to the first surface of the intermediate member. In this case, the first insulating resin layer is formed on the first surface of the intermediate member, and the second insulating resin layer is formed on the second surface that is a side opposite to the first surface, so that warpage or the like due to each insulating resin layer can be suppressed.

Furthermore, the present disclosure relates to a substrate with built-in components as another aspect. This substrate with built-in components includes an intermediate member including an electronic component with a first electrode provided on a first surface thereof and a first electrically conductive layer provided on the first surface of the electronic component so as to cover the first electrode, and a first insulating resin layer formed on a first surface of the intermediate member. The first electrically conductive layer includes a first curable adhesive layer formed from of a curable adhesive layer including electrically conductive particles and a cured adhesive composition, and a first metal foil layer disposed on the first curable adhesive layer that is a surface on a side opposite to the electronic component. The electrically conductive particles of the first curable adhesive layer electrically connect the first electrode of the electronic component and the first metal foil layer.

In this substrate with built-in components, the first electrically conductive layer of the intermediate member is configured to have a first curable adhesive layer formed from a curable adhesive layer including electrically conductive particles and a cured adhesive composition and a first metal foil layer, and the electrically conductive particles of the first curable adhesive layer electrically connect the first electrode of the electronic component and the first metal foil layer. In this case, since the intermediate member including the electronic component is simplified, manufacturing of a substrate with built-in components can be simplified.

In this substrate with built-in components, the intermediate member may further include a second electrically conductive layer provided on a second surface on a side opposite to the first surface of the electronic component, and a second electrode may be provided on the second surface on a side opposite to the first surface of the electronic component. The second electrically conductive layer includes a second curable adhesive layer formed from a curable adhesive layer including electrically conductive particles and a cured adhesive composition, and a second metal foil layer disposed on the second curable adhesive layer that is a surface on a side opposite to the electronic component. The electrically conductive particles of the second curable adhesive layer electrically connect the second electrode of the electronic component and the second metal foil layer. In this case, since the intermediate member including the electronic component is further simplified, manufacturing of a substrate with built-in components can be more simplified. Furthermore, since the same cured adhesive layer is provided on each of both surfaces of the electronic component, the balance in the lamination direction becomes favorable, and even in a case where thermal expansion or the like occurs in the substrate with built-in components, uneven expansion can be suppressed.

The substrate with built-in components may further include a second insulating resin layer formed on a second surface on a side opposite to the first surface of the intermediate member. In this case, the first insulating resin layer is formed on the first surface of the intermediate member, and the second insulating resin layer is formed on the second surface that is a side opposite to the first surface, so that warpage or the like due to each insulating resin layer can be suppressed.

Advantageous Effects of Invention

According to the present disclosure, a method for manufacturing a substrate with built-in components can be more simplified.

DESCRIPTION OF EMBODIMENTS

Figure 1:
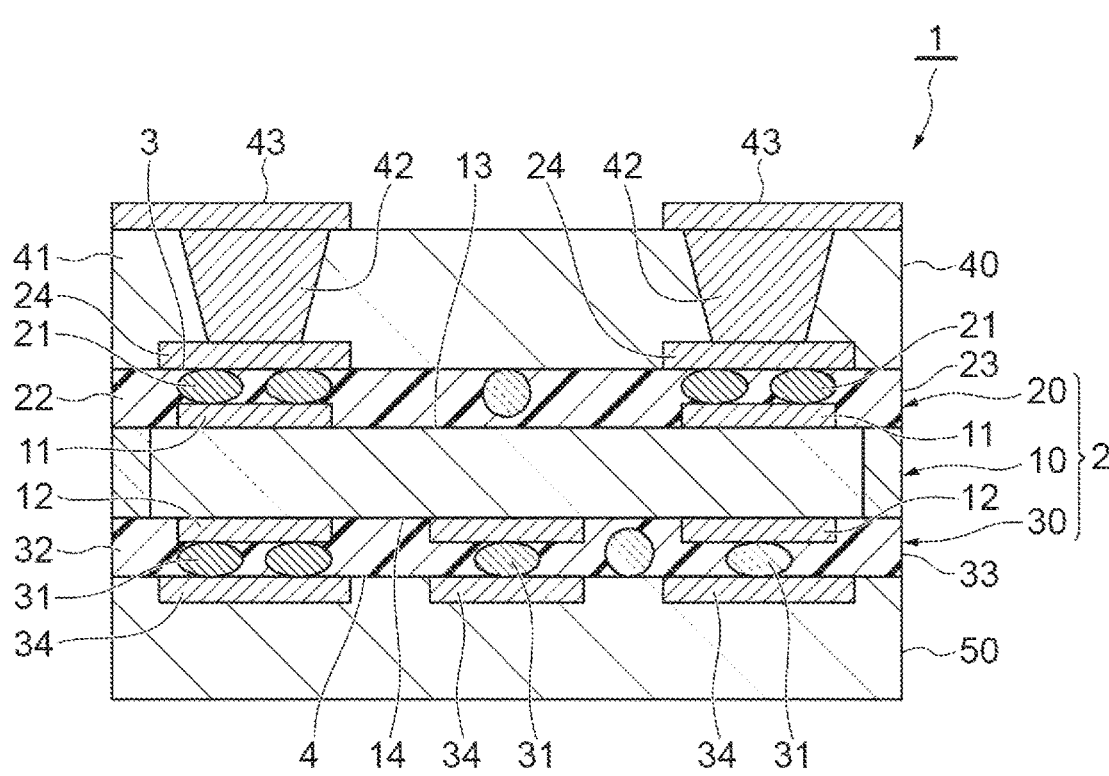
FIG. 1 is a cross-sectional view illustrating a substrate with built-in components according to an embodiment of the present disclosure.

Hereinafter, a substrate with built-in components and a method for manufacturing a substrate with built-in components according to an embodiment of the present disclosure will be described with reference to the drawings. In the following description, the same or similar portions are denoted with the same reference signs and repeated description is omitted. Furthermore, unless otherwise specified, positional relationships such as top, bottom, right, and left are assumed to be based on positional relationships illustrated in the drawings. Further, dimension ratios in the drawings are not limited to illustrated ratios.

FIG. 1 is a cross-sectional view illustrating a substrate with built-in components according to an embodiment of the present disclosure. As illustrated in FIG. 1, a substrate 1 with built-in components is configured to include an intermediate member 2 including an electronic component 10, a first electrically conductive layer 20, and a second electrically conductive layer 30, a first insulating resin layer 40, and a second insulating resin layer 50. The electronic component 10 is, for example, an electronic component such as an IC chip and has a first surface 13 and a second surface 14 on a side opposite to the first surface 13, a first electrode 11 is provided on the first surface 13, and a second electrode 12 is provided on the second surface 14 (see FIG. 3(*a*)). The electronic component 10 may be another electronic component such as a capacitor, and may have a configuration in which an electrically conductive layer and an insulating resin layer are provided only on one surface (for example, the first surface 13) side.

The first electrically conductive layer 20 is a layer including an electrically conductive region provided on the first surface 13 of the electronic component 10 so as to cover the first electrode 11 on the first surface 13, and electrically connects one electrode in a lamination direction to the other electrode. The first electrically conductive layer 20 has a first curable adhesive layer 23 formed from a curable adhesive layer 22 including electrically conductive particles 21 and a cured adhesive composition, and a first metal foil layer 24 (inner electrode) disposed on the first curable adhesive layer 23 that is a surface on a side opposite to the electronic component 10. The first metal foil layer 24 may be a metal foil layer before being processed and may be a metal foil layer after being processed into an electrode pattern or the like. As described below, the first electrically conductive layer 20 is obtained in such a manner that a first adhesive film 60 (see FIG. 3(*b*)) is heated and pressure-bonded to cause electrically conductive particles 61*a* of the first adhesive film 60 to electrically connect the first electrode 11 of the electronic component 10 to the first metal foil layer 24, and an adhesive layer 62 of the first adhesive film 60 is thermally cured (see FIG. 3(*c*)). That is, the adhesive layer portion of the first curable adhesive layer 23 is a cured product obtained by curing the adhesive composition having thermosetting property. Note that, the electrically conductive particles 21 are not particularly limited as long as they are particles having electrical conductivity, and may be metal particles configured by metals such as Au, Ag, Ni, Cu, and solder, electrically conductive carbon particles configured by electrically conductive carbon, or the like. The electrically conductive particles 21 may be coated electrically conductive particles each including a core which includes non-conductive glass, ceramic, plastic (such as polystyrene), or the like, and a coating layer which includes the metal or the electrically conductive carbon described above and covers the core. Furthermore, the electrically conductive particles 21 may be insulating coated electrically conductive particles each including the metal particles, the electrically conductive carbon particles, or the coated electrically conductive particles described above and an insulating material such as a resin and provided with an insulating layer which covers the surface of the particles.

The second electrically conductive layer 30 is a layer including an electrically conductive region provided on the second surface 14 of the electronic component 10 so as to cover the second electrode 12 on the second surface 14, and electrically connects one electrode in the lamination direction to the other electrode. The second electrically conductive layer 30 has a second curable adhesive layer 33 formed from a curable adhesive layer 32 including electrically conductive particles 31 and a cured adhesive composition, and a second metal foil layer 34 (inner electrode) disposed on the second curable adhesive layer 33 that is a surface on a side opposite to the electronic component 10. The second metal foil layer 34 may be a metal foil layer before being processed and may be a metal foil layer after being processed into an electrode pattern or the like. As described below, the second electrically conductive layer 30 is obtained in such a manner that a second adhesive film 70

Figure 3:
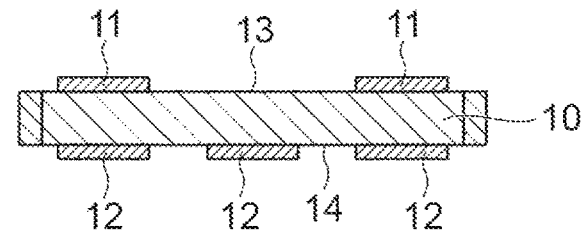
FIGS. 3(a) to 3(d) are cross-sectional views for sequentially describing a method for manufacturing the substrate with built-in components illustrated in FIG. 1.
Figure 3:
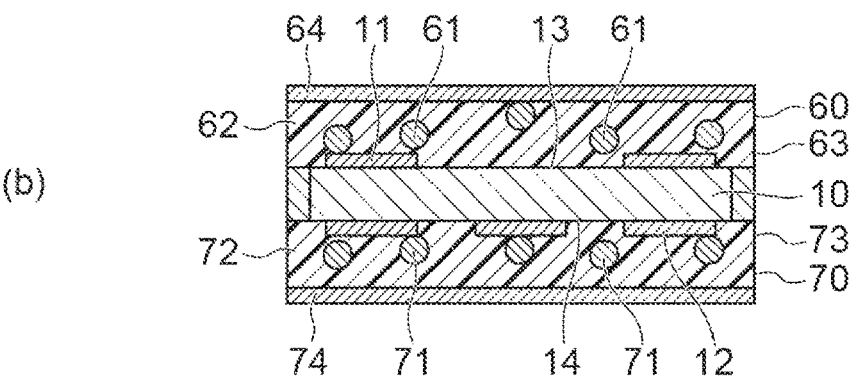
Figure 3:
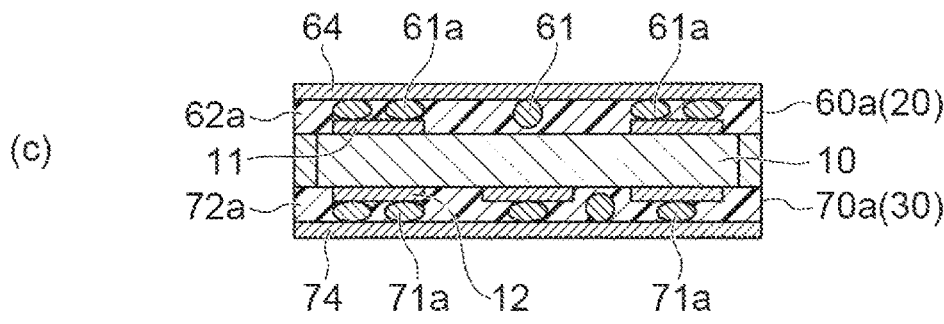
Figure 3:
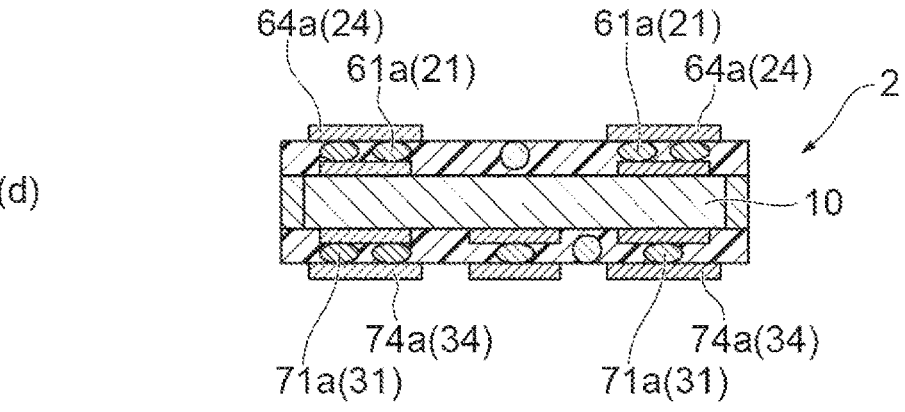

(see FIG. 3(*b*)) is heated and pressure-bonded to cause electrically conductive particles 71*a* of the second adhesive film 70 to electrically connect the second electrode 12 of the electronic component 10 to the second metal foil layer 34, and an adhesive layer 72 of the second adhesive film 70 is thermally cured (see FIG. 3(*c*)). That is, the adhesive layer portion of the second curable adhesive layer 33 is a cured product obtained by curing the adhesive composition having thermosetting property. Note that, the electrically conductive particles 31 are not particularly limited as long as they are particles having electrical conductivity, and may be metal particles configured by metals such as Au, Ag, Ni, Cu, and solder, electrically conductive carbon particles configured by electrically conductive carbon, or the like. The electrically conductive particles 31 may be coated electrically conductive particles each including a core which includes non-conductive glass, ceramic, plastic (such as polystyrene), or the like, and a coating layer which includes the metal or the electrically conductive carbon described above and covers the core. Furthermore, the electrically conductive particles 31 may be insulating coated electrically conductive particles each including the metal particles, the electrically conductive carbon particles, or the coated electrically conductive particles described above and an insulating material such as a resin and provided with an insulating layer which covers the surface of the particles.

The first insulating resin layer 40 is a layer formed on a first surface 3 of the intermediate member 2 and has an insulating layer 41, via conductors 42, and external electrodes 43. The insulating layer 41 is configured to include, for example, a resin such as epoxy and inorganic particles such as glass. The insulating layer 41 may include a reinforcing material such as glass cloth. The via conductor 42 is an electrically conductive member for electrically connecting the first metal foil layer 24 (inner electrode) of the intermediate member 2 to the external electrode 43, and is configured by plating filled in through-holes provided in the insulating layer 41, or the like. The external electrode 43 is electrically connected to an upper end of this via conductor 42.

The second insulating resin layer 50 is an insulating layer formed on a second surface 4 of the intermediate member 2. The second insulating resin layer 50 is configured to include, for example, a resin such as epoxy and inorganic particles such as glass. The second insulating resin layer 50 may include a reinforcing material such as glass cloth. The second insulating resin layer 50 may have a via conductor and an external electrode as in the first insulating resin layer 40.

Figure 2:
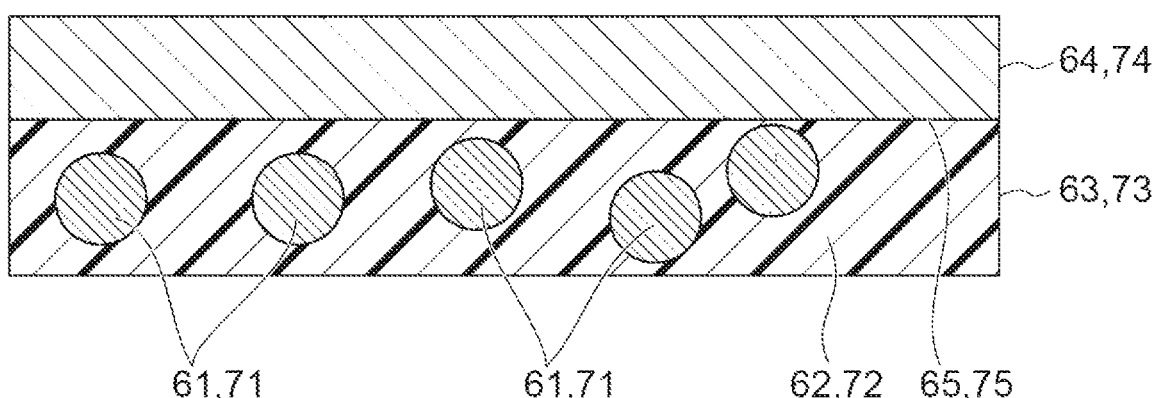
FIG. 2 is a cross-sectional view illustrating an adhesive film used when the substrate with built-in components illustrated in FIG. 1 is manufactured.
Figure 4:
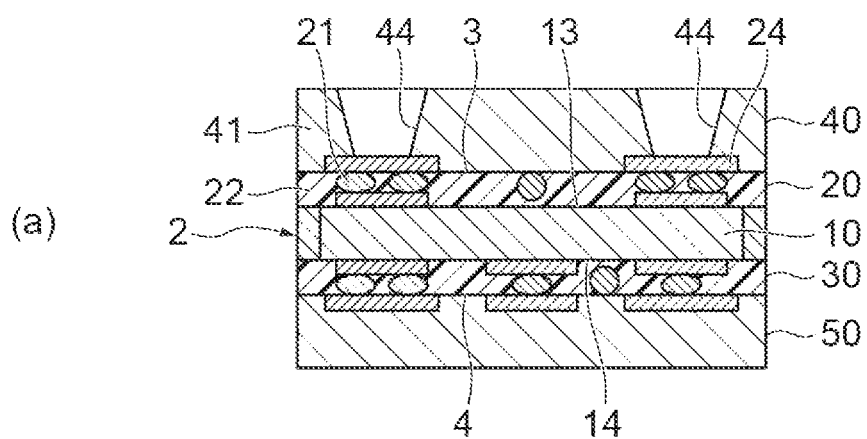
FIGS. 4(a) to 4(c) are cross-sectional views for sequentially describing the method for manufacturing the substrate with built-in components illustrated in FIG. 1 and illustrate steps subsequent to FIG. 3.
Figure 4:
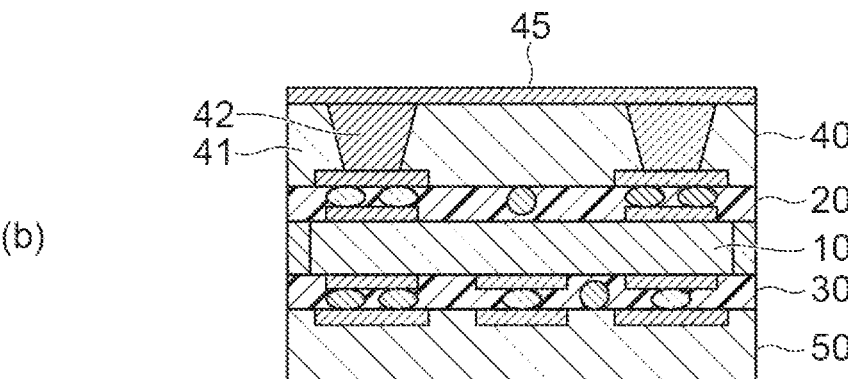
Figure 4:
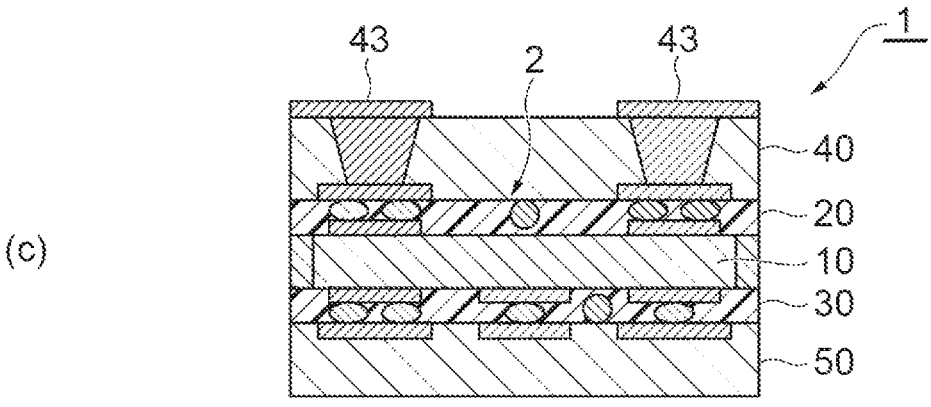
Figure 5:
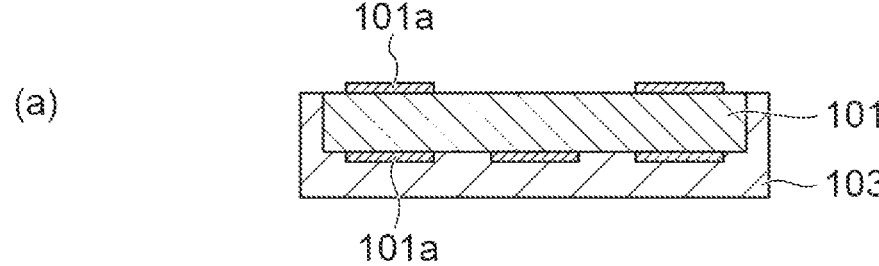
FIGS. 5(a) to 5(d) are cross-sectional views for sequentially describing a conventional method for manufacturing a substrate with built-in components.
Figure 5:
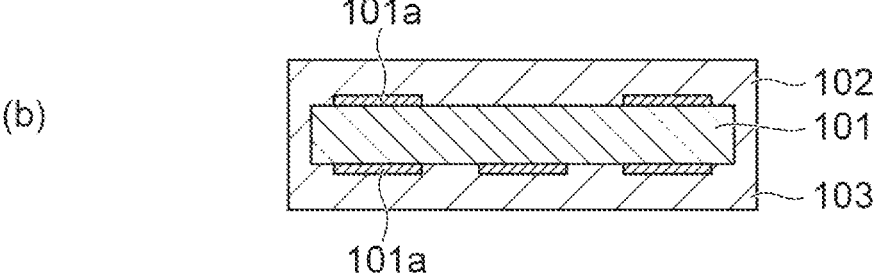
Figure 5:
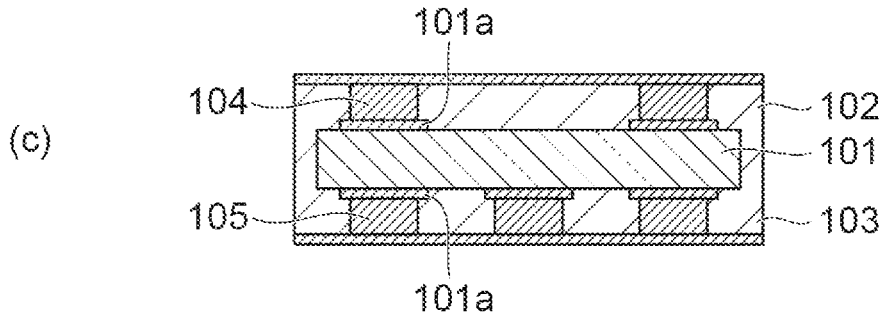
Figure 5:
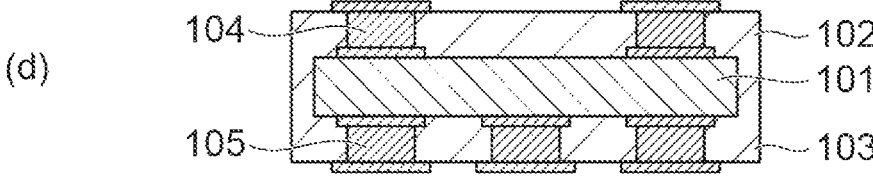
Figure 6:
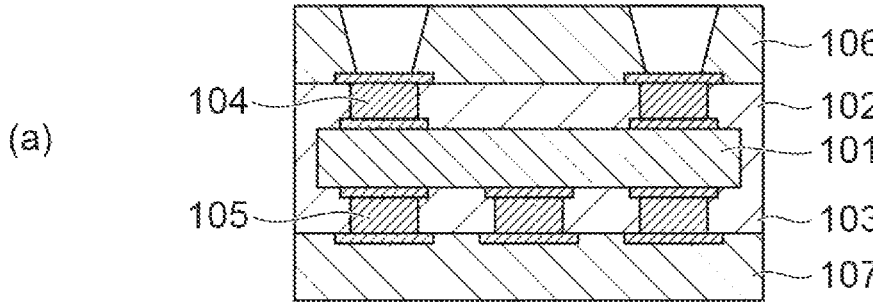
FIGS. 6(a) to 6(c) are cross-sectional views for sequentially describing the conventional method for manufacturing a substrate with built-in components and illustrate steps subsequent to FIG. 5.
Figure 6:
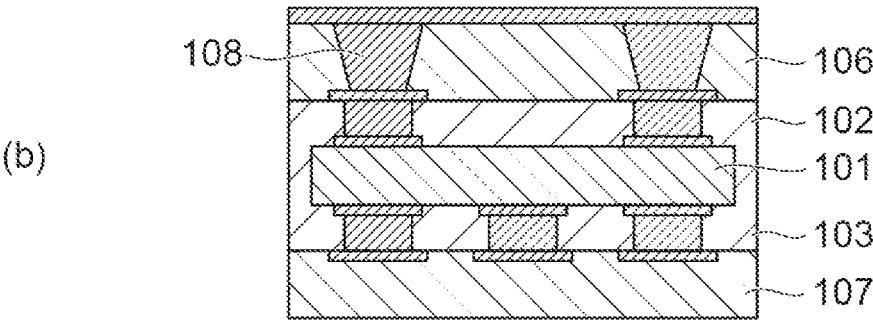
Figure 6:
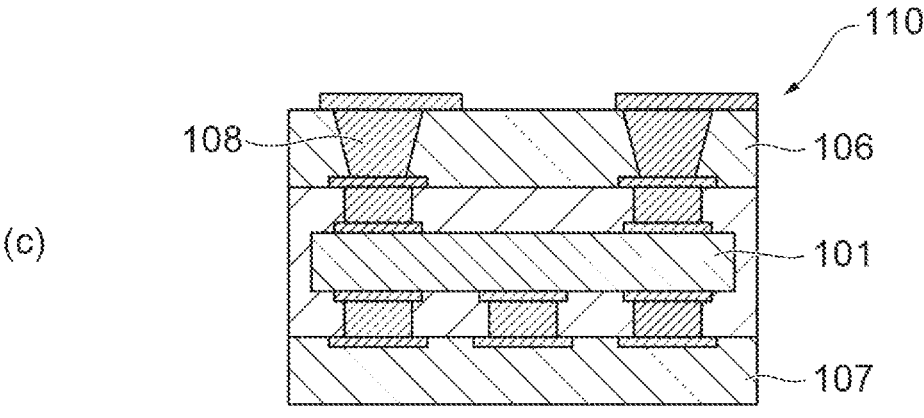

Next, a method for manufacturing the aforementioned substrate with built-in components will be described with reference to FIG. 2 to FIG. 4. FIG. 2 is a cross-sectional view illustrating an adhesive film used when the substrate with built-in components illustrated in FIG. 1 is manufactured. FIGS. 3(*a*) to 3(*d*) are cross-sectional views for sequentially describing a method for manufacturing the substrate with built-in components illustrated in FIG. 1. FIGS. 4(*a*) to 4(*c*) are cross-sectional views for sequentially describing the method for manufacturing the substrate with built-in components illustrated in FIG. 1 and illustrate steps subsequent to FIG. 3. The method for manufacturing a substrate with built-in components according to the present embodiment includes: a step (a) of providing an intermediate member which includes an electronic component with a first electrode and a second electrode provided on a first surface and a second surface thereof, respectively, a first electrically conductive layer provided on the first surface of the electronic component so as to cover the first electrode, and a second electrically conductive layer provided on the second surface of the electronic component so as to cover the second electrode; a step (b) of forming a first insulating resin layer on a first surface of the intermediate member; a step (c) of forming a second insulating resin layer on a second surface on a side opposite to the first surface of the intermediate member; and a step (d) of forming a via conductor reaching the first metal foil layer or an outer electrode processed from the first metal foil layer, in the first insulating resin layer formed on the first surface of the intermediate member. Hereinafter, detailed description will be given. Note that, the order of the steps (a) to (d) is not limited to the order described above, and the order thereof can be appropriately changed. For example, the steps may be performed in order of the steps (a), (b), (c), and (d), may be performed in order of the steps (a), (c), (b), and (d), and may be performed in order of the steps (a), (b), (d), and (c).

[Step (a) of Providing Intermediate Member]

The step (a) of providing the intermediate member 2 has a step (a1) of preparing the electronic component 10, a step (a2) of preparing a first adhesive film, a step (a3) of bonding the first adhesive film to the first surface of the electronic component so as to cover the first electrode, a step (a4) of heating and pressure-bonding the first adhesive film to the electronic component, and a step (a5) of etching the first metal foil layer to form an outer electrode of the intermediate member. Furthermore, an outer electrode may be formed on the second surface side of the intermediate member by the same method.

In the step (a1) of preparing the electronic component, as illustrated in FIG. 3(*a*), the electronic component 10 with the first electrode 11 and the second electrode 12 provided on the first surface 13 and the second surface 14 thereof, respectively, is prepared. The electronic component 10 is, for example, an electronic component such as an IC chip. Furthermore, a plurality of the first electrodes 11 and second electrodes 12 may be provided.

In the step (a2) of preparing an adhesive film, as illustrated in FIG. 2, the first adhesive film 60, which has a first adhesive layer 63 formed from an adhesive layer 62 which includes a plurality of electrically conductive particles 61 and an adhesive composition and in which the electrically conductive particles 61 are dispersed in the adhesive composition, and a first metal foil layer 64 on the first adhesive layer 63, is prepared. Similarly, the second adhesive film 70, which has a second adhesive layer 73 formed from an adhesive layer 72 which includes a plurality of electrically conductive particles 71 and an adhesive composition and in which the electrically conductive particles 71 are dispersed in the adhesive composition, and a second metal foil layer 74 disposed on the second adhesive layer 73 that is a surface on a side opposite to the electronic component 10. The first adhesive film 60 and the second adhesive film 70 as described above are members for forming a wiring. Each adhesive composition of the adhesive layer 62 and the adhesive layer 72 is an adhesive composition including an insulating resin having thermosetting property such as an epoxy resin, a phenolic resin, or an acrylic resin, and the electrically conductive particles 61 and 71 having a particle diameter of several μm are dispersed and blended in the adhesive composition.

An average particle diameter Dp of the electrically conductive particles 61 and 71 may be 1 μm or more, may be 2 μm or more, and may be 5 μm or more, from the viewpoint of excellent dispersibility and electrical conductivity. The average particle diameter Dp of the electrically conductive particles may be 50 μm or less, may be 30 μm or less, and may be 20 μm or less, from the viewpoint of excellent dispersibility and electrical conductivity. From the above-described viewpoint, the average particle diameter Dp of the electrically conductive particles may be 1 to 50 μm, may be 5 to 30 μm, may be 5 to 20 μm, and may be 2 to 20 μm.

A maximum particle diameter of the electrically conductive particles 61 and 71 may be smaller than the minimum interval between electrodes in the wiring pattern (the shortest distance between electrodes adjacent to each other). The maximum particle diameter of the electrically conductive particles 61 and 71 may be 1 μm or more, may be 2 μm or more, and may be 5 μm or more, from the viewpoint of excellent dispersibility and electrical conductivity. The maximum particle diameter of the electrically conductive particles may be 50 μm or less, may be 30 μm or less, and may be 20 μm or less, from the viewpoint of excellent dispersibility and electrical conductivity. From the above-described viewpoint, the maximum particle diameter of the electrically conductive particles may be 1 to 50 μm, may be 2 to 30 μm, and may be 5 to 20 μm.

In the present specification, the particle diameters of randomly selected 300 (pcs) particles are measured by observation using a scanning electron microscope (SEM), and the average value of the particle diameters thus obtained is regarded as the average particle diameter Dp, and the largest value thus obtained is regarded as the maximum particle diameter of the particles. Note that, in a case where the shape of the particle is not a spherical shape, for example, the particle has a projection, the particle diameter of the particle is a diameter of a circle circumscribing the particle in an SEM image.

The first metal foil layer 64 and the second metal foil layer 74 are, for example, a copper foil, an aluminum foil, a nickel foil, stainless steel, titanium, or platinum. The surface roughness Rz of a surface 65 of the first metal foil layer 64 on a side attached to the first adhesive layer 63 may be 20 μm or less, the surface roughness Rz thereof may be 0.5 μm or more and 5.0 μm or less, and the surface roughness Rz thereof may be 0.5 μm or more and 10 μm or less. The surface roughness Rz of a surface 75 of the second metal foil layer 74 on a side attached to the second adhesive layer 73 may be 20 μm or less, the surface roughness Rz thereof may be 0.5 μm or more and 5.0 μm or less, and the surface roughness Rz thereof may be 0.5 μm or more and 10 μm or less.

The surface roughness Rz means ten-point average roughness Rzjis as measured according to the method defined in JIS standard (JIS B 0601-2001), and refers to a value as measured using a commercially available surface roughness state measuring machine. For example, the surface roughness can be measured using a nano search microscope ("SFT-3500" manufactured by SHIMADZU CORPORATION).

Herein, a relation between the average particle diameter Dp of the electrically conductive particles 61 and the surface roughness Rz of the surface 65 of the first metal foil layer 64, and a relation between the average particle diameter Dp of the electrically conductive particles 71 and the surface roughness Rz of the surface 75 of the second metal foil layer 74, will be described below. In the present embodiment, each of ratios of the surface roughness Rz of the surfaces 65 and 75 of the metal foil layers 64 and 74 with respect to the average particle diameter Dp of the electrically conductive particles 61 and 71, that is, "surface roughness/average particle diameter" may be 0.03 or more, may be 0.04 or more, may be 0.05 or more, may be 0.06 or more, may be 0.1 or more, may be 0.2 or more, may be 0.3 or more, may be 0.5 or more, and may be 1 or more. Furthermore, each of the ratios of the surface roughness Rz of the surfaces 65 and 75 of the metal foil layers 64 and 74 with respect to the average particle diameter Dp of the electrically conductive particles 61 and 71, that is, "surface roughness/average particle diameter" may be 3 or less, may be 2 or less, may be 1.7 or less, and may be 1.5 or less. Each of the ratios of the surface roughness Rz of the surfaces 65 and 75 of the metal foil layers 64 and 74 with respect to the average particle diameter Dp of the electrically conductive particles 61 and 71, that is, "surface roughness/average particle diameter" may be, for example, 0.05 or more and 3 or less, and more specifically, may be 0.06 or more and 2 or less. In the present embodiment, the surface roughness Rz of the surfaces 65 and 75 of the metal foil layers 64 and 74 and the average particle diameter Dp of the electrically conductive particles 61 and 71 may be managed so that each of the ratios of the surface roughness Rz of the surfaces 65 and 75 of the metal foil layers 64 and 74 with respect to the average particle diameter Dp of the electrically conductive particles 61 and 71, that is, "surface roughness/average particle diameter" is in a range of 0.05 to 3.

In a case where the ratio of the surface roughness Rz of each of the surfaces 65 and 75 of the metal foil layers 64 and 74 on a side attached to the adhesive layers 63 and 73 with respect to the average particle diameter of the electrically conductive particles 61 and 71 is 0.05 to 3, as compared to a case where this ratio is more than 3, it is found that the electrically conductive particles 61 and 71 can be more reliably crushed into a flat shape so that the contact area between the electrically conductive particles 61 and 71 and the metal foil layers 64 and 74 can be increased. Thus, by setting the ratio of the surface roughness Rz with respect to the average particle diameter in the above range, electrical conduction between the metal foil layers 64 and 74 serving as wiring patterns or wirings after processing and another wiring patterns or wirings to which the adhesive layers 63 and 73 are attached, can be stabilized.

In the steps (a3) and (a4) of bonding the adhesive film, as illustrated in FIG. 3(b), the first adhesive film 60 is bonded to the first surface 13 of the electronic component 10 so as to cover the first electrode 11 on the first surface 13. Similarly, the second adhesive film 70 is bonded to the second surface 14 of the electronic component 10 so as to cover the second electrode 12 on the second surface 14. At this time, the first metal foil layer 64 and the second metal foil layer 74 are disposed so as to be located on a side opposite to the electronic component 10.

In the step (a) of heating and pressure-bonding the adhesive film, as illustrated in FIG. 3(c), the first adhesive film 60 and the second adhesive film 70 are heated and pressure-bonded to be bonded to the electronic component 10. The first adhesive film 60 is heated and pressure-bonded to cause the electrically conductive particles 61a of the first adhesive film 60 to electrically connect the first electrode 11 on the first surface 13 of the electronic component 10 to the first metal foil layer 64, and the adhesive layer 62 of the first adhesive film 60 is cured to obtain a first curable adhesive layer 60a (20). Similarly, the second adhesive film 70 is heated and pressure-bonded to cause the electrically conductive particles 71a of the second adhesive film 70 to electrically connect the second electrode 12 on the second surface 14 of the electronic component 10 to the second metal foil layer 74, and the adhesive layer 72 of the second adhesive film 70 is cured to obtain a second curable adhesive layer 70a (30). The heating and the pressure-bonding of the first adhesive film 60 and the second adhesive film 70 may be simultaneously performed and may be sequentially performed. At this time, when the ratio of the surface roughness Rz of each of the surfaces 65 and 75 of the metal foil layers 64 and 74 on a side attached to the adhesive layers 63 and 73 with respect to the average particle diameter of the electrically conductive particles 61 and 71 is 0.05 to 3, or the surface roughness Rz of each of the surfaces 65 and 75 of the first metal foil layer 64 and the second metal foil layer 74 is 20 μm or less, the electrically conductive particles 61 and 71 each are likely to be crushed into a flat shape, so that conduction of the electronic component 10 can be stabilized.

Subsequently, in the step (a6) of forming an outer electrode of the intermediate member, as illustrated in FIG. 3(d), the first metal foil layer 64 of the first curable adhesive layer 60a is etched so as to be a predetermined electrode 64a (24). Similarly, the second metal foil layer 74 of the second curable adhesive layer 70a is etched so as to be a predetermined electrode 74a (34). As a result, via electrodes connected to the electronic component 10 are formed in the intermediate member 2. In the above-described step (a), since an electrically conductive layer of the electronic component 10 is formed using an adhesive film including electrically conductive particles, each electrically conductive layer connecting electrodes separated from each other in the lamination direction can be easily formed without performing conventional cumbersome processes, such as hole formation by laser, formation of a plated layer, and electrode formation by etching, outside of the electronic component. As a result, according to this manufacturing method, the method for manufacturing the substrate 1 with built-in components can be simplified.

When the step (a) of providing an intermediate member is ended, in the steps (b) and (c) of forming an insulating resin layer, as illustrated in FIG. 4(a), the first insulating resin layer 40 is formed on the first surface 3 of the intermediate member 2, and the second insulating resin layer 50 is formed on the second surface 4 on a side opposite to the first surface 3 of the intermediate member 2. Thereafter, holes 44 are formed on a predetermined place of the first insulating resin layer 40 by laser or the like. The holes 44 are holes reaching the electrode (first metal foil layer 24) of the intermediate member 2 from the outside of the first insulating resin layer 40. Thereafter, as illustrated in FIG. 4(b), plating is filled in the holes 44 to form the via conductors 42 and an electrode layer 45. Then, etching is further performed so that the electrode layer 45 becomes a predetermined external electrode 43 to obtain the substrate 1 with built-in components illustrated in FIG. 4(c).

As described above, in the method for manufacturing the substrate 1 with built-in components according to the present embodiment, the first electrically conductive layer 20 of the intermediate member 2 provided in the step (a) is configured to have the first curable adhesive layer 23 formed from the curable adhesive layer 22 (62a) including the electrically conductive particles 21 (61a) and a cured adhesive composition and the first metal foil layer 24, and the electrically conductive particles 21 of the first curable adhesive layer 23 electrically connect the first electrode 11 of the electronic component 10 and the first metal foil layer 24. Similarly, the second electrically conductive layer 30 of the intermediate member 2 is configured to have the second curable adhesive layer 33 formed from the curable adhesive layer 32 (72a) including the electrically conductive particles 31 (71a) and a cured adhesive composition and the second metal foil layer 34, and the electrically conductive particles 31 of the second curable adhesive layer 33 electrically connect the second electrode 12 of the electronic component 10 and the second metal foil layer 34. As described above, in the manufacturing method according to the present embodiment, since the configuration of the intermediate member 2 including the electronic component 10 can be simplified, the method for manufacturing the substrate 1 with built-in components can be simplified as compared to a conventional case.

Furthermore, in the method for manufacturing a substrate with built-in components according to the present embodiment, the ratio of the surface roughness Rz of the corresponding surface 65 or 75 of at least one metal foil layer of the first metal foil layer 64 and the second metal foil layer 74 on a side attached to the adhesive layer with respect to the average particle diameter of the electrically conductive particles 61 or 71, may be 0.05 to 3. Alternatively, the surface roughness Rz of the surface of at least one metal foil layer of the first metal foil layer 64 and the second metal foil layer 74 on a side attached to the corresponding adhesive layer 63 or 73 may be 20 µm or less. In this case, as compared to a case where the aforementioned ratio of the surface roughness Rz with respect to the average particle diameter is more than 3 or a case where the surface roughness of the surface of the metal foil layer on the adhesive layer side is rough, the electrically conductive particles 61 and 71 can be more reliably crushed into a flat shape during heating and pressure-bonding so that the contact area of the electrically conductive particles with the metal foil layer and the electrode of the electronic component by the electrically conductive particles 61a and 71a can be increased. In other words, in a case where the aforementioned ratio of the surface roughness Rz with respect to the average particle diameter is more than 3 or a case where the surface of the metal foil layer on the adhesive layer side is rough, the electrically conductive particles may enter into the rough shape thereof so that the electrically conductive particles cannot be sufficiently crushed (for example, crushed into a flat shape) at the time of heating and pressure-bonding, and conduction may be unstable. But, by setting the aforementioned ratio of the surface roughness Rz with respect to the average particle diameter to 0.05 to 3 or the surface roughness Rz of the surface of the metal foil layer to 20 µm or less, the electrically conductive particles can be reliably crushed at the time of heating and pressure-bonding. As a result, electrical conduction between the metal foil layer serving as a wiring pattern or a wiring after processing and the electrode of the electronic component can be stabilized by such electrically conductive particles.

Furthermore, in the substrate 1 with built-in components according to the present embodiment, the first electrically conductive layer 20 of the intermediate member 2 is configured to have the first curable adhesive layer 23 formed from the curable adhesive layer 22 including the electrically conductive particles 21 and a cured adhesive composition, and the first metal foil layer 24. The electrically conductive particles 21 of the first curable adhesive layer 23 electrically connect the first electrode 11 of the electronic component 10 and the first metal foil layer 24. Similarly, the second electrically conductive layer 30 of the intermediate member 2 is configured to have the second curable adhesive layer 33 formed from the curable adhesive layer 32 including the electrically conductive particles 31 and a cured adhesive composition, and the second metal foil layer 34. The electrically conductive particles 31 of the second curable adhesive layer 33 electrically connect the second electrode 12 of the electronic component 10 and the second metal foil layer 34. In this case, since the intermediate member 2 including the electronic component 10 is more simplified using the adhesive film, manufacturing of the substrate 1 with built-in components can be more simplified. Furthermore, since the same cured adhesive layer is provided on each of both surfaces of the electronic component 10, the balance in the lamination direction becomes favorable, and even in a case where thermal expansion or the like occurs in the substrate 1 with built-in components, uneven expansion can be suppressed.

Hereinbefore, embodiments of the present disclosure have been described in detail, but the present disclosure is not limited to the above-described embodiments and can be applied to various embodiments. For example, in the above-described embodiment, as illustrated in FIG. 2, the adhesive films 60 and 70 have a configuration in which the electrically conductive particles 61 and 71 are randomly or averagely dispersed in the adhesive layers 63 and 73, but a configuration in which the electrically conductive particles 61 and 71 are disposed (unevenly distributed) to be adjacent to the metal foil layers 64 and 74 may be employed. In this case, in the adhesive layers 63 and 73, the electrically conductive particles 61 and 71 are not exposed on surfaces on a side opposite to the metal foil layers 64 and 74, and the thickness of a portion of each of the adhesive layers 62 and 72 existing between the electrically conductive particles 61 and 71 and the surfaces 65 and 75 of the metal foil layers 64 and 74 may be more than 0 µm and 1 µm or less. In this case, since the electrically conductive particles 61 and 71 are disposed to be adjacent to the metal foil layers 64 and 74, the electrically conductive particles 61 and 71 can be more reliably crushed into a flat shape by the metal foil layers 64 and 74. Furthermore, by locally distributing the electrically conductive particles 61 and 71 on the metal foil layers 64 and 74 side in this way, a retention rate of the electrically conductive particles 61 and 71 into a wiring (electrode) or the like can be improved. That is, conduction can be more stabilized.

Furthermore, the adhesive layers 62 and 72 may be formed to be divided into the first adhesive layer near the metal foil layers 64 and 74 and the second adhesive layer separated from the metal foil layers 64 and 74. The adhesive composition constituting the first adhesive layer and the second adhesive layer may be the same adhesive composition as the adhesive composition constituting the adhesive layers 62 and 72 described above, but the electrically conductive particles 61 and 71 may be dispersed only in the first adhesive layer and the electrically conductive particles 61 and 71 may not be dispersed in the second adhesive layer, that is, may not be included. Also in this case, similarly to the above-described case, since the electrically conductive particles 61 and 71 are disposed to be adjacent to the metal foil layers 64 and 74, the electrically conductive particles 21 can be more reliably crushed into a flat shape by the metal foil layers 64 and 74. Furthermore, by unevenly distributing the electrically conductive particles 61 and 71 on the metal foil layers 64 and 74 side in this way, a retention rate of the electrically conductive particles 61 and 71 into a wiring (electrode) or the like can be improved. That is, conduction can be more stabilized.

REFERENCE SIGNS LIST

1: substrate with built-in components, 2: intermediate member, 3: first surface, 4: second surface, 10: electronic component, 11: first electrode, 12: second electrode, 13: first surface, 14: second surface, 20: first electrically conductive layer, 21, 61, 61a: electrically conductive particle, 22: curable adhesive layer, 23: first curable adhesive layer, 24, 64: first metal foil layer, 31, 71, 71*a*: electrically conductive particle, 32: curable adhesive layer, 33: second curable adhesive layer, 34, 74: second metal foil layer, 40: first insulating resin layer, 42: via conductor, 50: second insulating resin layer, 60: first adhesive film, 62: adhesive layer, 63: first adhesive layer, 65, 75: surface, 70: second adhesive film, 72: adhesive layer, 73: second adhesive layer.

The invention claimed is:

1. A method for manufacturing a substrate with built-in components, the method comprising:

providing an intermediate member including an electronic component with a first electrode provided on a first surface thereof, and a first electrically conductive layer provided on the first surface of the electronic component so as to cover the first electrode; and forming a first insulating resin layer on a first surface of the intermediate member, wherein the first electrically conductive layer includes a first curable adhesive layer formed from a curable adhesive layer including electrically conductive particles and a cured adhesive composition, and a first metal foil layer disposed on the first curable adhesive layer that is a surface on a side opposite to the electronic component, and wherein the electrically conductive particles of the first curable adhesive layer electrically connect the first electrode of the electronic component and the first metal foil layer, wherein the providing of the intermediate member includes:

preparing the electronic component;

preparing a first adhesive film;

bonding the first adhesive film to the first surface of the electronic component so as to cover the first electrode; and heating and pressure-bonding the first adhesive film to the electronic component, wherein the first adhesive film includes a first adhesive layer formed from an adhesive layer which includes electrically conductive particles and an adhesive composition and in which the electrically conductive particles are dispersed in the adhesive composition, and the first metal foil layer disposed on the first adhesive layer that is a surface on a side opposite to the electronic component, and wherein in the heating and pressure-bonding, the first adhesive film is heated and pressure-bonded to cause the electrically conductive particles of the first adhesive film to electrically connect the first electrode of the electronic component to the first metal foil layer, and the adhesive layer of the first adhesive film is cured to obtain the first curable adhesive layer, and wherein a ratio of surface roughness Rz of a surface of the first metal foil layer on a side attached to the corresponding adhesive layer with respect to an average particle diameter of the electrically conductive particles is 0.05 to 3.

2. The method for manufacturing a substrate with built-in components according to claim 1, wherein the intermediate member further includes a second electrically conductive layer provided on a second surface on a side opposite to the first surface of the electronic component, wherein a second electrode is provided on the second surface on a side opposite to the first surface of the electronic component, wherein the second electrically conductive layer includes a second curable adhesive layer formed from a curable adhesive layer including electrically conductive particles and a cured adhesive composition, and a second metal foil layer disposed on the second curable adhesive layer that is a surface on a side opposite to the electronic component, and wherein the electrically conductive particles of the second curable adhesive layer electrically connect the second electrode of the electronic component and the second metal foil layer.

3. The method for manufacturing a substrate with built-in components according to claim 2, wherein the providing of the intermediate member further includes:

preparing a second adhesive film;

bonding the second adhesive film to the second surface of the electronic component so as to cover the second electrode; and heating and pressure-bonding the second adhesive film to the electronic component, wherein the second adhesive film includes a second adhesive layer formed from an adhesive layer which includes electrically conductive particles and an adhesive composition and in which the electrically conductive particles are dispersed in the adhesive composition, and the second metal foil layer disposed on the second adhesive layer that is a surface on a side opposite to the electronic component, and wherein in the heating and pressure-bonding, the second adhesive film is heated and pressure-bonded to cause the electrically conductive particles of the second adhesive film to electrically connect the second electrode of the electronic component to the second metal foil layer, and the adhesive layer of the second adhesive film is cured to obtain the second curable adhesive layer.

4. The method for manufacturing a substrate with built-in components according to claim 2, wherein a ratio of surface roughness Rz of a surface of at least one metal foil layer of the first metal foil layer and the second metal foil layer on the corresponding curable adhesive layer side with respect to an average particle diameter of the electrically conductive particles is 0.05 to 3.

5. The method for manufacturing a substrate with built-in components according to claim 2, wherein surface roughness Rz of a surface of at least one metal foil layer of the first metal foil layer and the second metal foil layer on the corresponding curable adhesive layer side is 20 μm or less.

6. The method for manufacturing a substrate with built-in components according to claim 5, wherein surface roughness Rz of a surface on the curable adhesive layer side is 0.5 μm or more and 10 μm or less.

7. The method for manufacturing a substrate with built-in components according to claim 1, wherein the providing of the intermediate member further includes:

etching at least one of the first metal foil layer and the second metal foil layer to form an outer electrode of the intermediate member.

8. The method for manufacturing a substrate with built-in components according to claim 1, the method further comprising:

forming a via conductor reaching the first metal foil layer or the outer electrode processed from the first metal foil layer in the first insulating resin layer formed on the first surface of the intermediate member.

9. The method for manufacturing a substrate with built-in components according to claim 1, the method further comprising:

forming a second insulating resin layer on a second surface on a side opposite to the first surface of the intermediate member.

10. A method for manufacturing a substrate with built-in components, the method comprising:

providing an intermediate member including an electronic component with a first electrode provided on a first surface thereof, and a first electrically conductive layer provided on the first surface of the electronic component so as to cover the first electrode; and forming a first insulating resin layer on a first surface of the intermediate member, wherein the first electrically conductive layer includes a first curable adhesive layer formed from a curable adhesive layer including electrically conductive particles and a cured adhesive composition, and a first metal foil layer disposed on the first curable adhesive layer that is a surface on a side opposite to the electronic component, and wherein the electrically conductive particles of the first curable adhesive layer electrically connect the first electrode of the electronic component and the first metal foil layer, wherein the providing of the intermediate member includes:

preparing the electronic component;

preparing a first adhesive film;

bonding the first adhesive film to the first surface of the electronic component so as to cover the first electrode; and heating and pressure-bonding the first adhesive film to the electronic component, wherein the first adhesive film includes a first adhesive layer formed from an adhesive layer which includes electrically conductive particles and an adhesive composition and in which the electrically conductive particles are dispersed in the adhesive composition, and the first metal foil layer disposed on the first adhesive layer that is a surface on a side opposite to the electronic component, and wherein in the heating and pressure-bonding, the first adhesive film is heated and pressure-bonded to cause the electrically conductive particles of the first adhesive film to electrically connect the first electrode of the electronic component to the first metal foil layer, and the adhesive layer of the first adhesive film is cured to obtain the first curable adhesive layer, wherein surface roughness Rz of a surface of at least one metal foil layer of the first metal foil layer and the second metal foil layer on a side attached to the corresponding adhesive layer is 20 μm or less.

11. The method for manufacturing a substrate with built-in components according to claim 10, wherein surface roughness Rz of a surface of at least one metal foil layer of the first metal foil layer and the second metal foil layer on a side attached to the corresponding adhesive layer is 0.5 μm or more and 10 μm or less.

12. A substrate with built-in components, comprising:

an intermediate member including an electronic component with a first electrode provided on a first surface thereof, and a first electrically conductive layer provided on the first surface of the electronic component so as to cover the first electrode; and a first insulating resin layer formed on a first surface of the intermediate member, wherein the first electrically conductive layer includes a first curable adhesive layer formed from a curable adhesive layer including electrically conductive particles and a cured adhesive composition, and a first metal foil layer disposed on the first curable adhesive layer that is a surface on a side opposite to the electronic component, wherein the electrically conductive particles of the first curable adhesive layer electrically connect the first electrode of the electronic component and the first metal foil layer, and wherein a ratio of surface roughness Rz of a surface of the first metal foil layer on the first curable adhesive layer side with respect to an average particle diameter of the electrically conductive particles is 0.05 to 3.

13. The substrate with built-in components according to claim 12, wherein the intermediate member further includes a second electrically conductive layer provided on a second surface on a side opposite to the first surface of the electronic component, wherein a second electrode is provided on the second surface on a side opposite to the first surface of the electronic component, wherein the second electrically conductive layer includes a second curable adhesive layer formed from a curable adhesive layer including electrically conductive particles and a cured adhesive composition, and a second metal foil layer disposed on the second curable adhesive layer that is a surface on a side opposite to the electronic component, and wherein the electrically conductive particles of the second curable adhesive layer electrically connect the second electrode of the electronic component and the second metal foil layer.

14. The substrate with built-in components according to claim 12, further comprising a second insulating resin layer formed on a second surface on a side opposite to the first surface of the intermediate member.

15. The substrate with built-in components according to claim 12, wherein surface roughness Rz of a surface of the first metal foil layer on the first curable adhesive layer side is 20 μm or less.

16. The substrate with built-in components according to claim 12, wherein surface roughness Rz of a surface of the first metal foil layer on the first curable adhesive layer side is 0.5 μm or more and 10 μm or less.

17. The substrate with built-in components according to claim 12, wherein the ratio of surface roughness Rz of a surface of the first metal foil layer on the first curable adhesive layer side with respect to an average particle diameter of the electrically conductive particles is 0.06 to 2.

18. The substrate with built-in components according to claim 12, wherein a ratio of surface roughness Rz of a surface of the first metal foil layer on the first curable adhesive layer side with respect to an average particle diameter of the electrically conductive particles is 0.06 to 2.

* * * * *